United States Patent [19]
Seo

[11] Patent Number: 5,827,760
[45] Date of Patent: Oct. 27, 1998

[54] METHOD FOR FABRICATING A THIN FILM TRANSISTOR OF A LIQUID CRYSTAL DISPLAY DEVICE

[75] Inventor: Seong Moh Seo, Kyungki-do, Rep. of Korea

[73] Assignee: LG Electronics Inc., Seoul, Rep. of Korea

[21] Appl. No.: 798,826

[22] Filed: Feb. 12, 1997

[30] Foreign Application Priority Data

Feb. 12, 1996 [KR] Rep. of Korea ............. 1996-3288

[51] Int. Cl.$^6$ ................................................ H01L 21/223
[52] U.S. Cl. .................... 438/161; 438/542; 438/558; 438/163; 438/563; 438/564
[58] Field of Search .................... 438/542, 543, 438/544, 545, 558, 563, 564, 163, 161, 322, 324

[56] References Cited

U.S. PATENT DOCUMENTS

| | | | |
|---|---|---|---|
| 4,601,097 | 7/1986 | Shimbo | 29/572 |
| 4,958,205 | 9/1990 | Takeda et al. | 357/23.7 |
| 5,424,244 | 6/1995 | Zhang et al. | 437/173 |
| 5,466,617 | 11/1995 | Shannon | 437/40 |
| 5,622,814 | 4/1997 | Miyata et al. | 430/314 |
| 5,658,808 | 8/1997 | Lin | 438/155 |
| 5,668,027 | 9/1997 | Hashimoto | 437/44 |
| 5,773,804 | 3/1998 | Hack et al. | 438/158 |

FOREIGN PATENT DOCUMENTS 6-21457  1/1994  Japan ..................................... 29/784

OTHER PUBLICATIONS

X. Tong et al. "Effect of Si–Substrate Heating during Laser–Induced B–Doping" Appl. Phys. A vol. 59 (Mar.1994 pp. 189–191.

*Primary Examiner*—Charles L. Bowers, Jr.
*Assistant Examiner*—Laura M. Schillinger
*Attorney, Agent, or Firm*—Finnegan, Henderson, Farabow, Garrett & Dunner, L.L.P.

[57] ABSTRACT

A thin film transistor is fabricated by introducing a dopant into an indium tin oxide layer or a gate insulating layer by an ion shower doping technique. An a-Si semiconductor layer is then deposited on the surface of the substrate and subjected to a single exposure of laser light. The laser exposure or annealing diffuses dopant into the semiconductor layer and activates the dopant to form an ohmic layer of n-type or p-type conductivity polysilicon, and an intrinsic polysilicon layer. A metal layer and an indium tin oxide layer are formed to the side of a gate electrode to maintain an electrical connection even if a break is formed in the data bus line.

20 Claims, 6 Drawing Sheets

METHOD FOR FABRICATING A THIN FILM TRANSISTOR OF A LIQUID CRYSTAL DISPLAY DEVICE

BACKGROUND OF THE INVENTION

The present invention relates to a thin film transistor, and more particularly to a method for fabricating a thin film transistor of a liquid crystal display device in which an n or p-type polysilicon ohmic layer and a channel layer of intrinsic polysilicon can be formed simultaneously by laser annealing of an amorphous silicon layer.

Active matrix liquid crystal displays (AMLCDs) are used for large screen area and high resolution applications. In the AMLCD, pixels are driven independently by selectively activating thin film transistors (TFTs) associated with each pixel.

FIG. 1 is a schematic view of a conventional AMLCD structure. As shown in FIG. 1, gate bus lines 22 and data bus lines 21 are connected to a gate driver circuit 30 and a data driver circuit 31, respectively. TFTs 20 are formed at the intersection of each of gate bus lines 22 and data bus lines 21. Gate electrodes of the TFTs 20 are connected to the gate bus lines 22, source electrodes are connected to the data bus lines 21, and the drains are connected to pixel electrodes 23.

When a voltage is applied to the gate electrode of TFT 20 through an associated gate bus line 22, TFT 20 is turned on to charge pixel electrode 23 with the input signal voltage from data driver circuit 31 through the data bus lines 21. As a result, the configuration of the liquid crystal changes to regulate the amount of light passing through pixel electrodes 23.

FIGS. 2a–2e illustrate various steps of a conventional process for manufacturing a TFT having a staggered structure. As shown in FIG. 2a, an indium tin oxide (ITO) layer 2 is first sputtered onto substrate 1 and then patterned to form the source/drain electrode and the data bus line. Thereafter, dopant is introduced into substrate 1 and the ITO layer 2 by a plasma chemical vapor deposition method using approximately 0.5% $PH_3$ in Ar. A semiconductor layer 10 consisting of a-Si is next formed on the substrate, as shown in FIGS. 2b and 2c. At this point, a small amount of dopant is deposited on the ITO layer 2. When semiconductor layer 10 is formed, the dopant on ITO layer 2 diffuses into the semiconductor layer to form ohmic layer 4, while leaving an undoped channel region 3.

As seen in FIG. 2d, semiconductor layer 10 is then patterned, so that ohmic layer 4 is formed overlapping ITO layer 2.

Further, a gate insulating layer 6, consisting of SiNx, is formed over the entire substrate 1 and then a metal, such as Al and Cr., is deposited thereon and patterned to form the gate electrode 5. A passivation layer 7 is further formed on gate electrode 5 and gate insulating layer 6.

In the TFT fabricated in accordance with the conventional method described above, the dopant is not adequately deposited on ITO layer 2, so that an insufficient amount of dopant diffuses into the semiconductor layer 10. Accordingly, it is difficult to obtain a suitable ohmic layer 4. In addition, the electron mobility of a-Si is relatively low. Thus, the switching speed of the above-described TFT is poor.

SUMMARY OF THE INVENTION

An object of the present invention is to provide a method for fabricating a thin film transistor for incorporation into a liquid crystal display device in which an ohmic layer of n-type or p-type polysilicon and a channel layer of intrinsic polysilicon are simultaneously formed by subjecting an amorphous layer to a single laser annealing step.

Another object of the present invention is to provide a method for fabricating a thin film transistor coupled to a double layer data bus line in order that the data bus line conduct signals even if a break occurs therein.

In order to achieve this object, the present invention comprises the steps of: forming a gate electrode on the substrate, successively forming a gate insulating layer and first metal layer on the gate electrode and substrate, forming a second metal layer on the gate insulating layer and the first metal layer, introducing a dopant in and on the surface of an indium tin oxide layer, forming a semiconductor layer over the entire substrate, exposing the semiconductor layer to laser light to form a plurality of crystals in the semiconductor layer and activate, as well as diffuse the dopant into the semiconductor layer, patterning the semiconductor to form the channel layer and the ohmic layer, forming a passivation layer on the entire substrate.

DETAILED DESCRIPTION OF THE INVENTION

FIG. 3 illustrates a method of fabricating a TFT according to a first embodiment of the present invention. In this embodiment, the TFT has an inverted coplannar structure.

Figure 1:
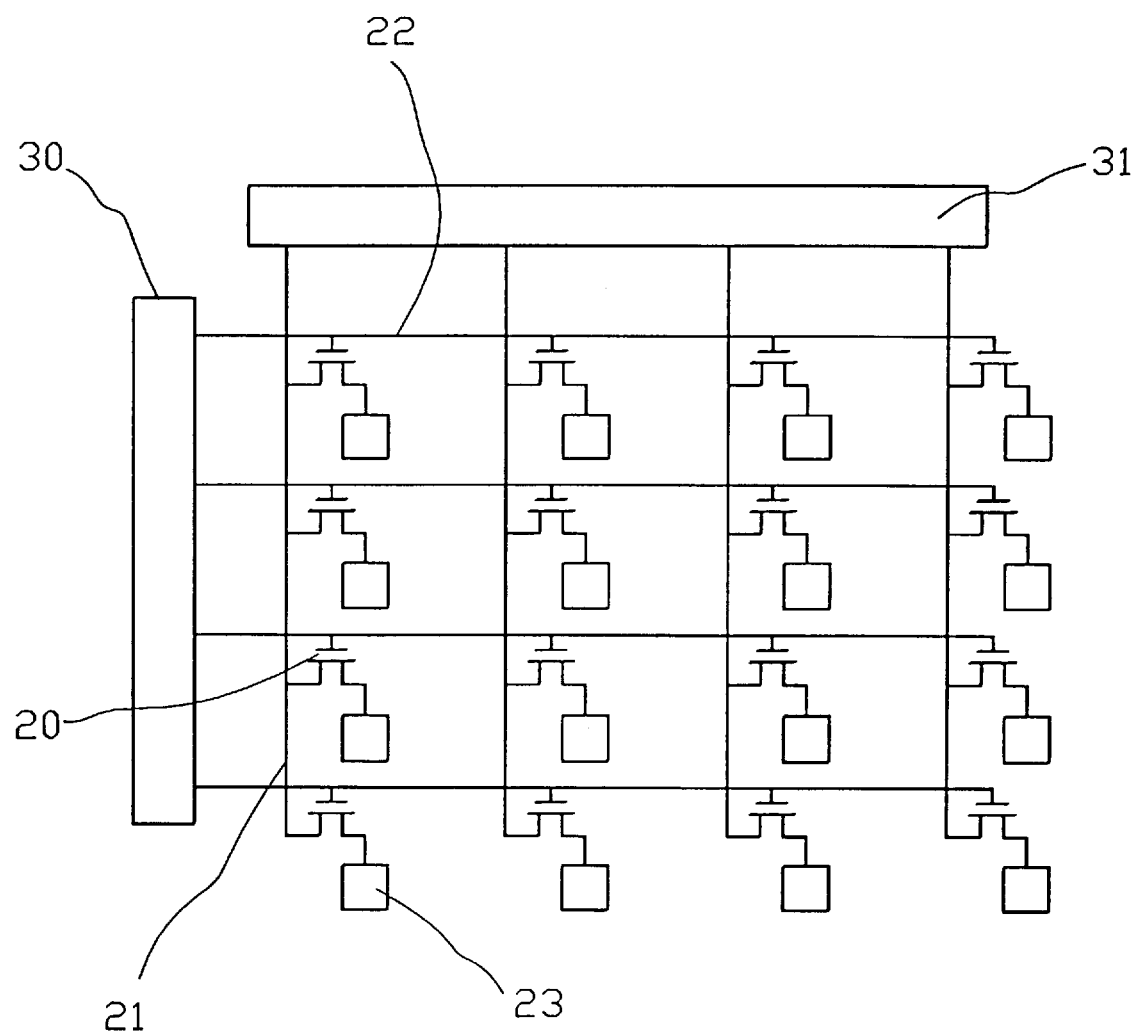
FIG. 1 is a schematic diagram of an active matrix thin film transistor.
Figure 2A:
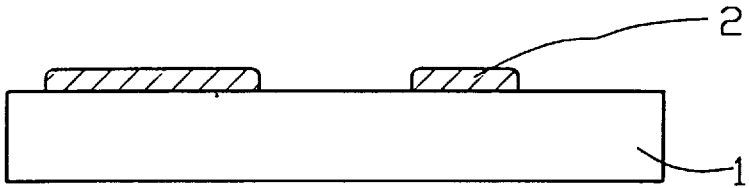
FIG. 2 is a view showing conventional fabrication method of a thin film transistor having a staggered structure.
Figure 2B:
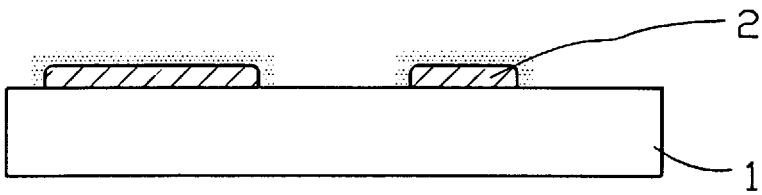
Figure 2C:
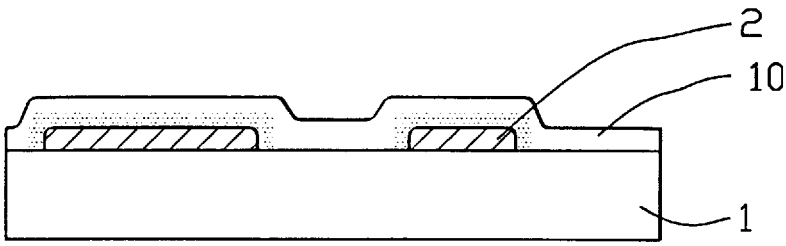
Figure 2D:
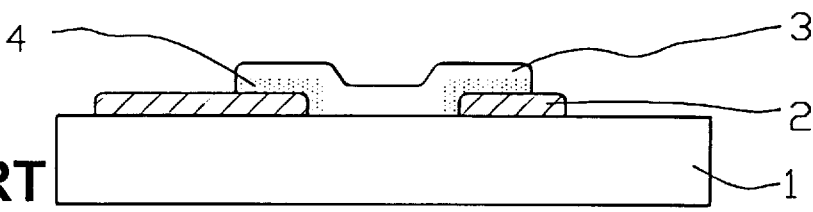
Figure 2E:
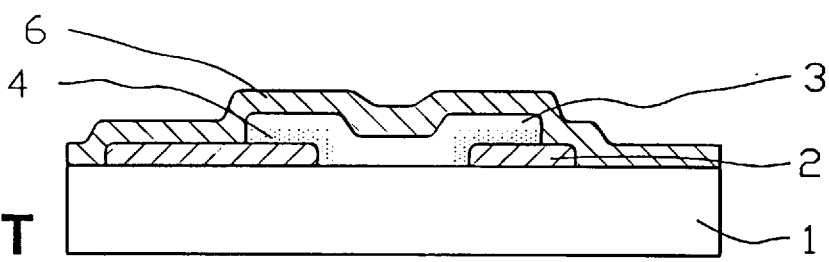
Figure 2F:
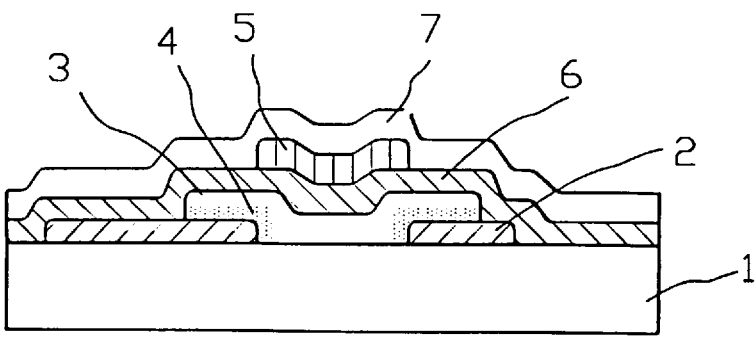
Figure 3A:
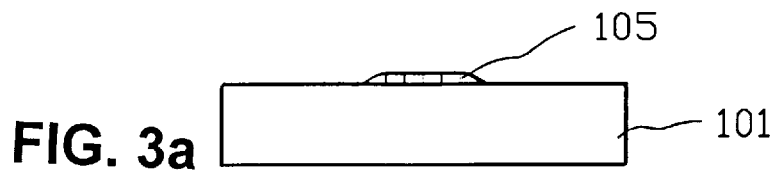
FIG. 3 illustrates various steps of a TFT manufacturing process in accordance with a first embodiment of the present invention.
Figure 3B:
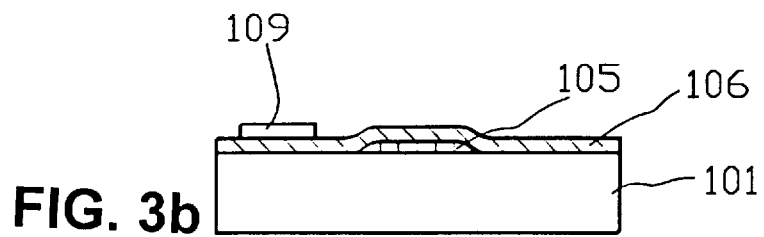

First, a first metal, such as Al and Cr is sputtered, for example, onto substrate 101 and then patterned to form a tapered gate electrode 105, as shown in FIG. 3a. Thereafter, $SiO_2$ is deposited on the gate electrode 105 and the substrate 101 typically by a CVD method to form the gate insulating layer 106. A second metal layer is then sputtered, for example, on gate insulating layer 106, and then patterned to form first data bus line 109 having predetermined width. First data line 109 is shown on the left of gate electrode 5 in FIG. 3b.

Figure 3C:
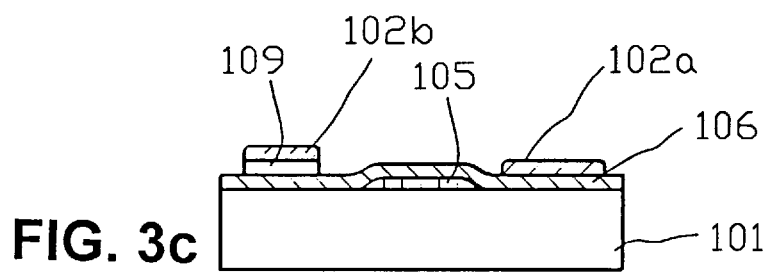

As shown in FIG. 3c, an ITO layer is deposited on first data bus line 109 and gate insulating layer 106, and then patterned to form the source/drain electrode 102a and the second data bus line 102b. Thus, second data bus line 102b is formed on first data bus line 109, and having the same width as first data bus line 109. Thus, first data bus line 109 constitutes a redundant element to maintain an electrical connection even if a break is created in data bus line 102b. Accordingly, even if the ITO layer is broken, the TFT is driven smoothly.

Figure 3D:
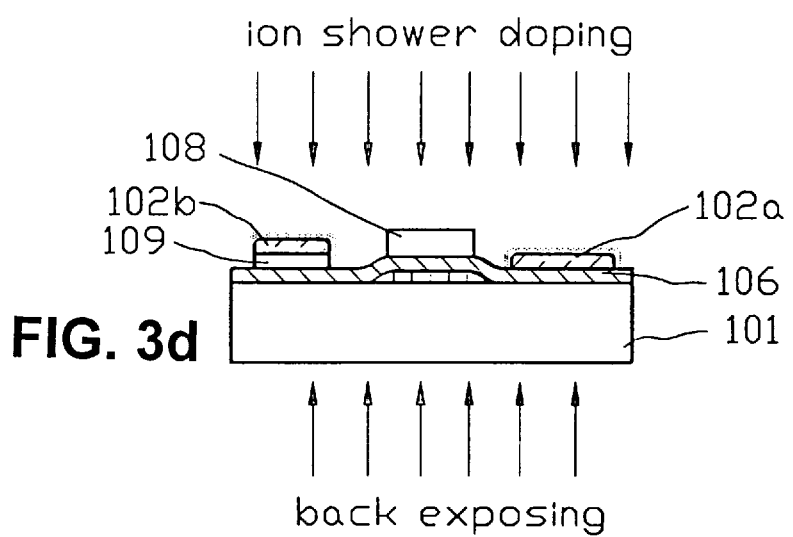
Figure 3E:
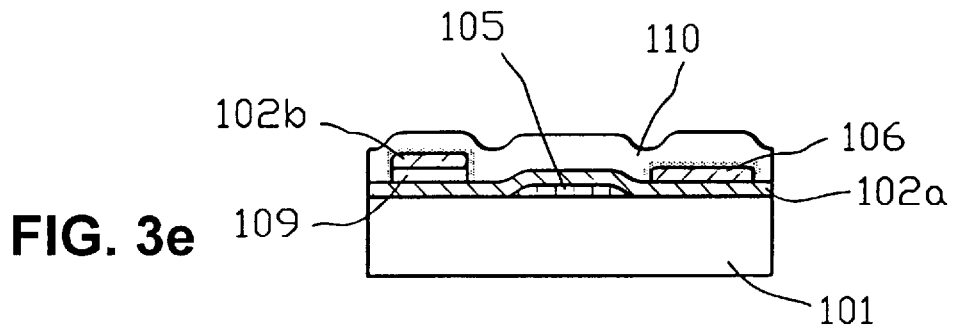

A photoresist layer 108 is then deposited over the surface of the substrate 101, and patterned by back exposure using gate electrode 105 as a mask, as shown in FIG. 3d. Thus, an unexposed portion of photoresist 108 remains over gate electrode 105. Accordingly, the dopant, such as phosphorus or boron is introduced into the substrate by ion shower except for the area corresponding to gate electrode 105, which is blocked by the photoresist 108. Photoresist 108 is then removed and then an a-Si semiconductor layer 110 is formed by, for example, plasma CVD, as shown in FIG. 3e. At that time, most of the dopant remains on the surface of the ITO layers 102a and 102b, while a small amount remains on the gate insulating layer 106.

Figure 3F:
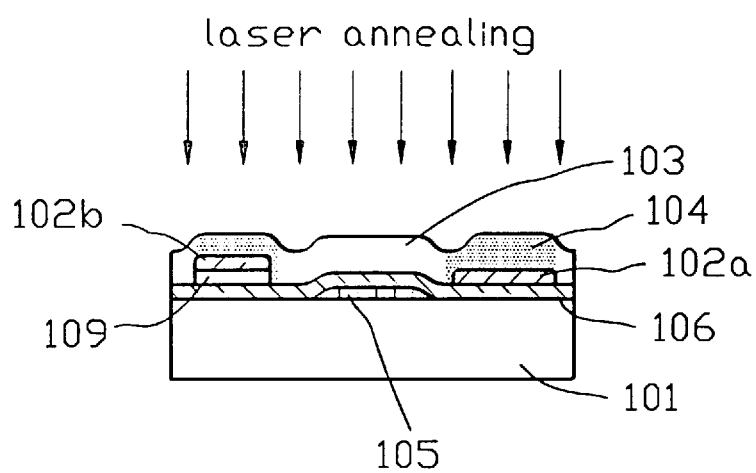

Semiconductor layer 110 is then annealed through a single exposure to laser light from an eximer laser, as shown in FIG. 3f. As a result, the dopant is diffused into the semiconductor layer 110 and activated to convert the a-Si to polysilicon (p-Si). Therefore, the portion of the semiconductor layer 110 where the dopant is doped becomes ohmic layer 104, including n-type or p-type p-Si, and the undoped portion over the gate electrode 105 becomes the channel layer 103 comprising intrinsic p-Si.

Figure 3G:
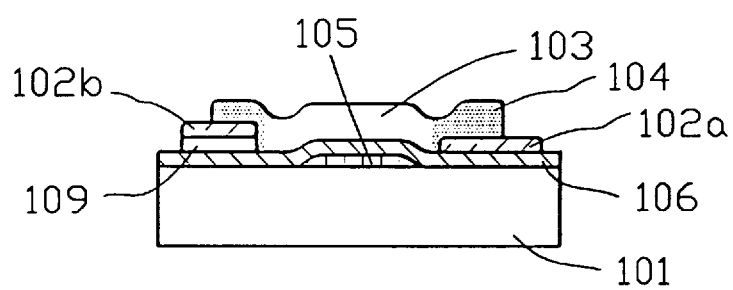
Figure 3H:
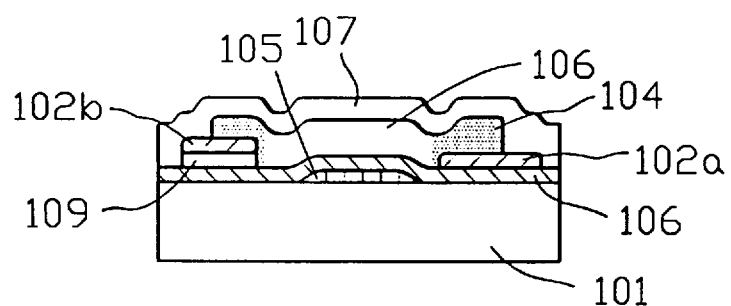

Furthermore, channel layer 103 is formed over the gate electrode 105 and the ohmic layers 104 are formed on opposite sides of channel layer 103. As seen in FIG. 3g, semiconductor layer 110 is patterned by selectively removing doped and undoped portions thereof. Passivation layer 107 is then formed on the semiconductor layer 110 and the ITO layers 102a and 102b.

In the above-described TFT having the inverted coplannar structure, the dopant introduced into the a-Si laser is activated by a single laser annealing step to simultaneously crystallize the a-Si layer to form ohmic layer 104, including either n-type or p-type p-Si, and the intrinsic channel layer 3.

FIGS. 4a–4g illustrate a method for fabricating a TFT having an inverted staggered structure in accordance with the present invention.

Figure 4A:
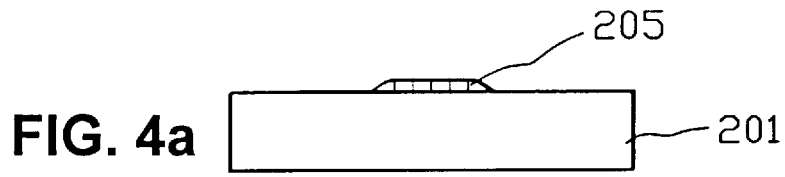
FIG. 4 illustrates various steps of a TFT manufacturing process in accordance with a second embodiment of the present invention.
Figure 4B:
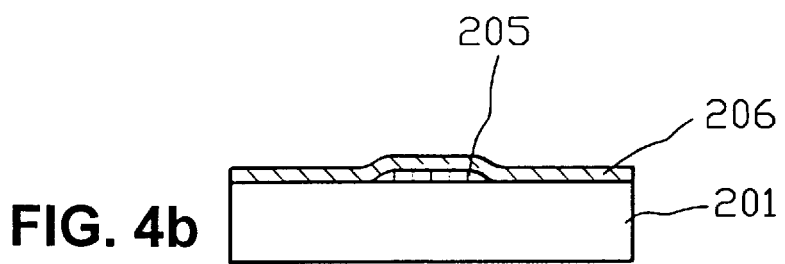
Figure 4C:
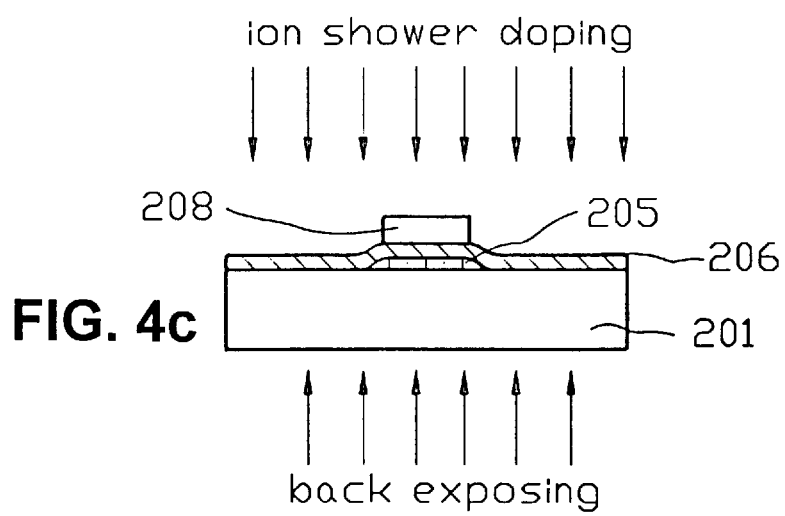

As seen in FIG. 4a, a metal, such as Al and Cr, is sputtered onto substrate 201, and patterned to form tapered gate electrode 205. Gate insulating layer 206 including $SiO_2$ is then formed, for example, by a CVD process, as shown in FIG. 4b. Photoresist 208 is next deposited on gate insulating layer 206, and patterned by back exposure using gate electrode 205 as a mask. Photoresist 208 formed over gate electrode 205 blocks the phosphorous or boron from doping the portion of insulating layer 206 over the gate electrode during the ion shower step. At that time, most dopant remains on the surface of the gate insulating layer 206, while a small amount diffuses into the gate insulating layer 206.

Figure 4D:
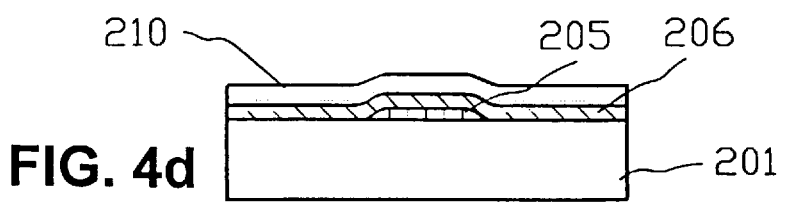
Figure 4E:
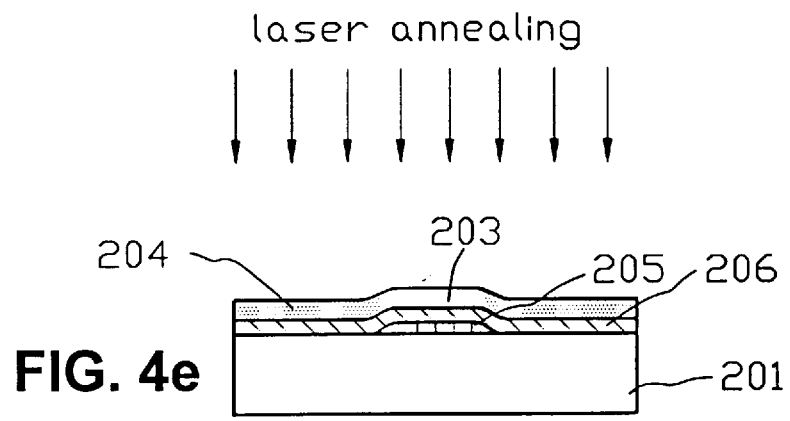

Semiconductor layer 210 comprising a-Si is next formed on gate insulating layer 206 after removing photoresist 208, as shown in FIG. 4d. Semiconductor layer 210 is then subjected to laser light from an eximer laser to crystallize the a-Si and convert it to polysilicon (p-Si). Further, the laser light activates the dopant 40 and diffuses it into the semiconductor layer 210. As a result, diffused regions of semiconductor layer 210 become ohmic layers 204 of n-type or p-type conductivity. Undoped portions, however, will become channel layer 203. Further, since the a-Si is crystallized by the laser annealing, the ohmic layer 204 and channel layer 203 become doped p-Si and intrinsic p-Si layers, respectively.

Figure 4F:
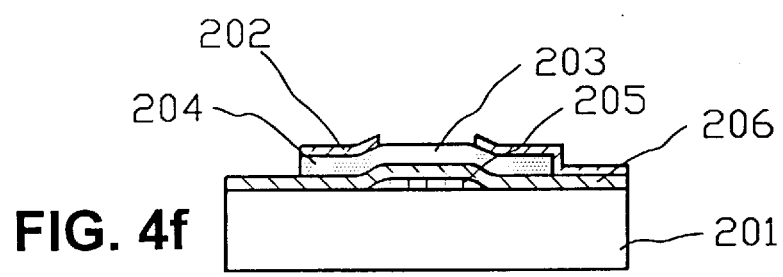
Figure 4G:
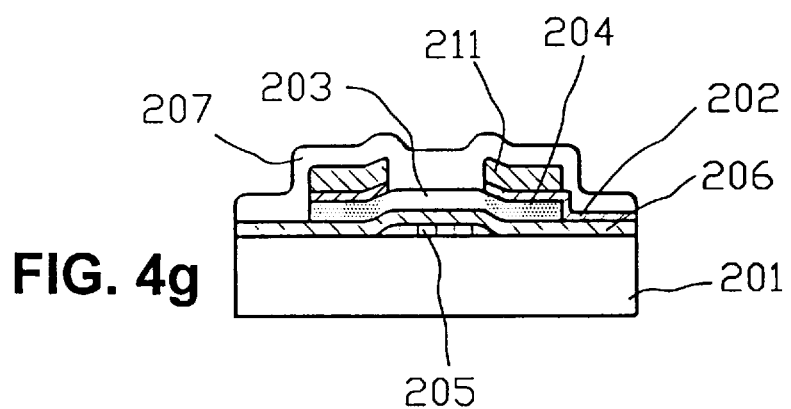

As shown in FIG. 4f, semiconductor layer 210 is patterned to form channel layer 203 over gate electrode 205 and ohmic layer 204 on opposite sides of channel layer 203. ITO layer 202 is then formed on the ohmic layer 204 as the first data bus line. At this time, one of the ITO layers 202 formed on the right side of the gate electrode 205 in FIG. 4f includes the pixel electrode. As shown in FIG. 4g, a metal, such as Al and Cr, is sputtered and patterned to form the source/drain electrode 211 and the second data bus line, and the passivation layer 207 comprising SiNx is formed thereon.

In the above-described TFT having an inverted staggered structure, p-Si ohmic layer 204 and p-Si channel layer 203 can be formed simultaneously, and the ITO layer 202 formed under the source/drain electrode is used for redundancy.

In the present invention, the n or p-type p-Si ohmic layer and the channel layer can be formed simultaneously by a single laser annealing step, and a redundant element is formed under the source/drain electrode and the data bus line. Therefore, the process is simplified and an open circuit or break in source/drain electrode and the data bus line can be avoided.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A method for fabricating a thin film transistor, comprising the steps of:

forming a gate electrode on a substrate;

forming a gate insulating layer on said substrate and said gate electrode;

forming a source/drain electrode and a data bus line on said gate insulating layer;

introducing a dopant into said source/drain electrode and said data bus line;

forming a semiconductor over the substrate, said semiconductor layer including an amorphous semiconductor layer;

exposing said semiconductor layer with laser light to thereby crystallize said semiconductor layer and form ohmic regions in said semiconductor layer; and patterning crystallized semiconductor layer said patterned semiconductor layer to form an ohmic layer and a channel layer.

2. A method for fabricating a thin film transistor of a liquid crystal display device according to claim 1, further comprising the step of forming a passivation layer on said substrate.

3. A method for fabricating a thin film transistor according to claim 1, wherein the step of forming said source/drain electrode and said data bus line comprises the steps of:

forming a first metal layer on said gate insulating layer; and forming a second metal layer on said first metal layer and said gate insulating layer.

4. A method for fabricating a thin film transistor according to claim 3, wherein said second metal layer includes indium tin oxide.

5. A method for fabricating a thin film transistor according to claim 1, wherein said gate electrode has a tapered shape.

6. A method for fabricating a thin film transistor device according to claim 1, wherein said introducing step includes an ion shower process.

7. A method for fabricating a thin film transistor according to claim 1, further comprising the steps of depositing a photoresist layer on said substrate; and patterning said photoresist layer to thereby shield said gate electrode from being doped.

8. A method for fabricating a thin film transistor according to claim 7, wherein said patterning step includes back exposure with light using said gate electrode as a mask.

9. A method for fabricating a thin film transistor according to claim 1, wherein a width of said first metal layer is approximately the same as that of said second metal layer.

10. A method for fabricating a thin film transistor according to claim 1, wherein said exposing step includes subjecting the semiconductor layer to a single laser beam exposed exposure step.

11. A method for fabricating a thin film transistor, comprising the steps of:
    forming a gate electrode on a substrate;
    forming a gate insulating layer on said substrate;
    introducing dopant into said gate insulating layer;
    forming a semiconductor layer on said gate insulating layer, said semiconductor layer including an amorphous silicon layer;
    exposing said semiconductor layer with laser light to crystallize said semiconductor layer;
    patterning said semiconductor so as to form a channel layer and an ohmic portions; and
    forming a source/drain electrode electrical coded respective ones of said ohmic portions.

12. A method for fabricating a thin film transistor according to claim 11, further comprising the step of forming a passivation layer over said substrate.

13. A method for fabricating a thin film transistor according to claim 11, wherein the step of forming said source/drain electrode and said data bus line comprises the steps of:
    forming a first metal layer on said ohmic layer; and
    forming a second metal layer on said first metal layer.

14. A method for fabricating a thin film transistor according to claim 13, said first metal layer includes an indium tin oxide layer.

15. A method for fabricating a thin film transistor according to claim 11, wherein said gate electrode has a tapered shape.

16. A method for fabricating a thin film transistor of a liquid crystal display device according to claim 11, wherein said introducing step includes an ion shower process.

17. A method for fabricating a thin film transistor according to claim 11, further comprising the step of depositing a photoresist layer on said substrate; and patterning said photoresist layer to shield said gate electrode from being doped.

18. A method for fabricating a thin film transistor of a liquid crystal display device according to claim 17, wherein said patterning step includes back exposure using a mask.

19. A method for fabricating a thin film transistor according to claim 11, wherein said exposing step includes the step of subjecting said semiconductor layer to a single laser beam exposure.

20. A method for fabricating a thin film transistor according to claim 11, further comprising the steps of: depositing an ITO layer on said data bus line; and patterning said ITO layer to have substantially the same width as said data bus line, wherein a width of said indium tin oxide is approximately same as that of said data bus line.

* * * * *